United States Patent
Noh et al.

(10) Patent No.: US 9,609,451 B2
(45) Date of Patent: Mar. 28, 2017

(54) MULTI-RATE SYSTEM FOR AUDIO PROCESSING

(71) Applicant: DTS, Inc., Calabasas, CA (US)

(72) Inventors: Daekyoung Noh, Newport Beach, CA (US); Themis Katsianos, Highland, CA (US)

(73) Assignee: DTS, Inc., Calabasas, CA (US)

( * ) Notice: Subject to any disclaimer, the term of this patent is extended or adjusted under 35 U.S.C. 154(b) by 37 days.

(21) Appl. No.: 14/824,998

(22) Filed: Aug. 12, 2015

(65) Prior Publication Data

US 2016/0240183 A1 Aug. 18, 2016

Related U.S. Application Data

(60) Provisional application No. 62/115,560, filed on Feb. 12, 2015.

(51) Int. Cl.
| | |
|---|---|
| *H03G 5/00* | (2006.01) |
| *H04R 3/00* | (2006.01) |
| *H04S 1/00* | (2006.01) |

(52) U.S. Cl.
CPC ............ *H04S 1/007* (2013.01); *H03G 5/005* (2013.01); *H04R 3/00* (2013.01)

(58) Field of Classification Search
CPC ............ G10L 19/0204; G10L 19/0208; G10L 19/167; G10L 21/02; G10L 21/0232; G10L 13/02; G10L 21/0208; G10L 21/0272; G10L 21/0316; H04R 3/00; H04R 3/04; H04R 3/003; H04R 3/005; H04R 3/14; H04R 1/22; H04R 1/1083; H04R 29/00; H04R 25/407; H03G 3/32; H03G 9/005; H03G 9/025; H04S 2420/07; H04S 1/007; G10K 2420/07; G10K 1/007

See application file for complete search history.

(56) References Cited

U.S. PATENT DOCUMENTS

| | | | |
|---|---|---|---|
| 6,606,388 B1 * | 8/2003 | Townsend | ............... H04S 1/007 381/1 |
| 6,868,377 B1 | 3/2005 | Laroche | |

(Continued)

OTHER PUBLICATIONS

Prentice Hall, Second Edition, "Discrete-Time Signal Processing," Alan V. Oppenheim of Massachusetts Institute of Technology, Ronald W. Schafer of Georgia Institute of Technology with John R. Buck of University of Massachusetts Dartmouth, Upper Saddle River, New Jersey, USA, Feb. 21, 2010, pp. 633-635.

(Continued)

*Primary Examiner* — Thang Tran
(74) *Attorney, Agent, or Firm* — Craig S. Fischer

(57) ABSTRACT

A multi-rate audio processing system and method provides real-time measurement and processing of amplitude/phase changes in the transition band of the lowest frequency subband caused by the audio processing that can be used to apply amplitude/phase compensation to the higher subband (s). Tone signals may be injected into the transition band to provide strong tonal content for measurement and processing. The real-time measurement and compensation adapts to time-varying amplitude/phase changes regardless of the source of the change (e.g. non-linear time-varying linear or user control parameters) and provides universal applicability for any linear audio processing.

26 Claims, 6 Drawing Sheets

(56) References Cited

U.S. PATENT DOCUMENTS

| | | | | |
|---|---|---|---|---|
| 7,346,177 | B2* | 3/2008 | Willems | H04R 5/04 381/61 |
| 8,306,241 | B2* | 11/2012 | Kim | H03G 3/32 381/104 |
| 8,983,834 | B2* | 3/2015 | Davis | G10L 19/008 704/231 |
| 2007/0052528 | A1* | 3/2007 | Wilson | B60C 23/0433 340/447 |
| 2008/0033730 | A1* | 2/2008 | Jot | H03H 17/0266 704/500 |
| 2009/0060209 | A1* | 3/2009 | Takeishi | H04R 3/04 381/17 |
| 2009/0063140 | A1 | 3/2009 | Villemoes et al. | |
| 2009/0226015 | A1* | 9/2009 | Zeng | H04R 25/353 381/316 |
| 2011/0110533 | A1* | 5/2011 | Choi | H03G 9/005 381/99 |
| 2012/0022676 | A1 | 1/2012 | Ishikawa et al. | |
| 2012/0140951 | A1 | 6/2012 | Solbach et al. | |

OTHER PUBLICATIONS

Information Science Reference, Multirate Filtering for Digital Signal Processing: MATLAB Applications, Ljiljana Milic, University of Belgrade, Hershey, New York, Jan. 1, 2009, pp. 207-237.

AES Convention Paper on "Multi-rate System for Arbitrary Audio Processing," Daekyoung Noh; AES Convention Paper on "Multi-rate System for Arbitrary Audio Processing," Daekyoung Noh; Presented at the 138th Convention, Warshaw, Poland; May 7-10, 2015; ten pages.

AES Convention Paper 7110 on "Efficient and high-quality equalization using a multirate filterbank and FIR filters," Riitia Vaananen and Jamrmo Hiipakka; Presented at the 122nd Convention; Vienna, Austria; May 5-8, 2007; eight pages.

Subband Wavelet Transforms Design and Applications, Chapter 11, pp. 347-367; "Acoustic Echo Cancellation Using Subband Adaptive Filtering," Phillip L. De Leon II and Delores M. Etier, Department of Electrical and Computer Engineering, University of Colorado, Boulder, USA, [research date]; twenty-two pages.

"Signal Restoration of Broad Band Speech Using Nonlinear Processing," Hiroshi Yasukawa; NTT Optical Network Systems Labs, Yokosuka, Japan; Nov. 12, 2011, four pages.

Institute of Electrical and Electronics Engineers, vol. 78, Issue 1; "Multirate Digital Filters, Filter Banks, Polyphase Networks, and Applications: A Tutorial, P.P. Vaidyanathan, IEEE," New York City, New York; Jan. 1990; thirty eight pages.

J. Audio Engineering Society, vol. 46, No. 3, "A Comparison of Computational Methods for Instantaneous Frequency and Group Delay of Discrete-Time Signals," V.C. Georgopoulos, Ohio University, School of Electrical Engineering and Computer Science, Athens, Ohio, USA and D. Pries, Tufts University, Department of Electrical Engineering and Computer Science Medford, Massachusetts, USA; Mar. 1998; twelve pages.

International Search Report and Written Opinion in related Application No. PCT/US2016/17197, mailed Jun. 12, 2016, 9 pages.

* cited by examiner

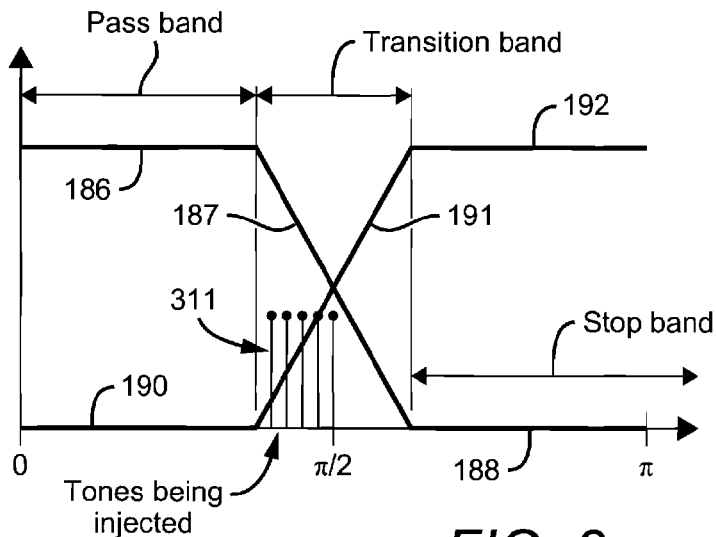
FIG. 3
FIG. 4
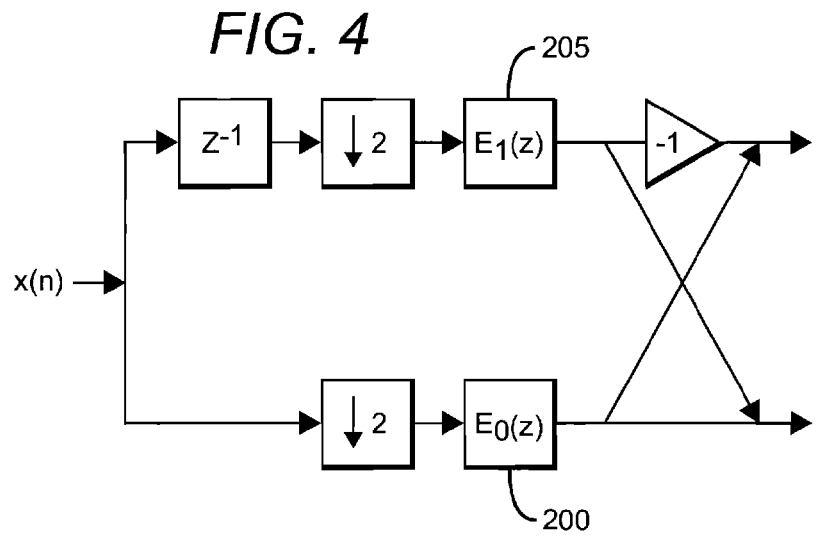
FIG. 5
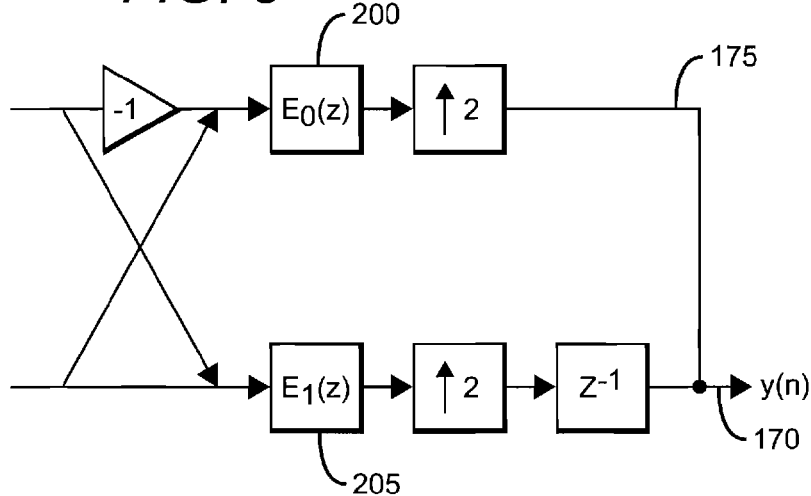

MULTI-RATE SYSTEM FOR AUDIO PROCESSING

CROSS-REFERENCE TO RELATED APPLICATIONS

This application claims benefit of priority under 35 U.S.C. 119(e) to U.S. Provisional Application Nos. 62/115,560 entitled "MULTI-RATE SYSTEM FOR ARBITRARY AUDIO PROCESSING" filed on Feb. 12, 2015, the entire contents of which are incorporated by reference.

BACKGROUND

Field of the Invention

This invention relates to multi-rate processing of digital audio, and more particular to techniques for compensating amplitude and phase artifacts caused by audio processing in the lowest frequency subband.

Description of the Related Art

Audio reproduction hardware that supports high sampling rate content is currently in use. However, audio processing techniques may not be required to process the full bandwidth of such content. Because audio processing at higher sampling rates requires greater computational resources, it is undesirable to perform audio processing designed for lower sampling rates at higher sampling rates. This is especially critical for systems having limited computational resources.

Various audio processing techniques use multi-rate processing because of its computational advantages. In general, multi-rate subband processing includes subband decomposition, decimation, and expansion processes. These processes allow signals to be processed at reduced sampling rates corresponding to the bandwidth of the subbands while preserving the full bandwidth of the original content in the reconstruction phase.

Some techniques apply audio processing only to the lowest frequency subband of the subbands in order to reduce computational complexity. However, performing audio processing in the lowest frequency subband often causes amplitude and phase changes. Existing techniques attempt to correct for these changes by adding compensation filters in the higher frequency subbands that match amplitude and phase in the transition band of the subbands. Existing techniques rely on either a priori knowledge of the audio processing to calculate the compensation filters or non-real-time measurements of amplitude/phase characteristics of the processing in the transition band of the subbands.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Embodiments of the multi-rate arbitrary audio processing system and method described herein are an efficient high sampling rate reproduction system for audio processing designed for lower sampling rates. To reduce computational complexity, high sampling rate signals are decimated and split into two subbands. The process may be repeated in the lowest subband to obtain a maximally decimated system. Embodiments of the system and method apply audio processing only to the lowest frequency subband to reduce computational complexity while preserving the full bandwidth of the original content in the reconstruction phase. The audio processing may be arbitrary; known or unknown, linear, non-linear or time-variant, or subject to user changes to various control parameters. Embodiments of the system and method are particularly well suited for audio processing such as non-linear processing or user set control parameters that produce time-varying or undetermined amplitude and phase changes. Embodiments of the system and method are well suited for arbitrary linear audio processing as the embodiments can be universally applied without having to redesign filters for each audio processing.

To overcome the amplitude and phase changes caused by audio processing in the low band, embodiments of the multi-rate arbitrary audio processing system and method use real-time amplitude and phase measurement and compensation methods for arbitrary audio processing to improve accuracy. In particular, amplitude and phase measurements are performed in the transition band of the lowest frequency subband and compensation is performed on the rest of the subbands to reduce aliasing noise and amplitude distortion that can be caused when the subbands are recombined. Embodiments of the audio processing process blocks of audio samples. The measurement and compensation methods suitably process the same blocks of audio samples to update the amplitude and phase compensation for each block. The subbands are up-sampled and recombined.

Embodiments of the system and method provide for real-time measurement and compensation by determining whether there is sufficient signal amplitude and tonal content in the transition band of the lowest frequency subband to reliably calculate the change in amplitude and phase caused by audio processing. If so, the amplitude and phase compensation are calculated and applied to the rest of the bands. If not, either the last calculated amplitude and phase compensation are applied to the rest of the subbands or the compensation is disabled until sufficient amplitude and tonal content is present in the transition band.

Embodiments of the system and method provide for real-time measurement and compensation by determining whether there is sufficient signal amplitude and tonal content in the transition band of the lowest subband to reliably calculate the change in amplitude and phase. If so, the amplitude and phase compensation are calculated and applied to the rest of the subbands. If not, one or more tone signals positioned in the transition band are added (injected) to the lowest subband before audio processing and subtracted (removed) from the lowest subband after audio processing. The one or more tone signals provide the tonal content and amplitude required to reliably calculate the amplitude and phase compensation. Embodiments measure the signal amplitude and phase in the lowest subband, determine the amplitude of the tone signal(s) to be higher than a noise signal in the transition band but low enough to make minimal change to the signal amplitude in the lowest subband and select the phase and frequency of the tone signal(s) to avoid cancellation of the signal in the transition band. Embodiments may remove signal in the transition band prior to audio processing and inject the signal back in after audio processing to provide clean measurements and calculations based only on the effects of audio processing on the one or more tone signals.

Embodiments of the system and method inject multiple tone signals spaced at different frequencies in the transition band. Embodiments calculate a weighted average of the measurements for the multiple tone signals to produce a single amplitude compensation value and a single delay compensation value. Embodiments calculate one or more compensation filters whose amplitude and phase characteristics approximately match the amplitude and phase characteristics of the audio processing in the transition band. Amplitude/delay compensation is more computationally efficient whereas the compensation filter provides more precise amplitude and phase compensation. The compensation filter may be recalculated for each block of audio processed samples or less frequently at a defined interval.

Embodiments of the system and method compare amplitudes of the full lowest frequency subband measurement (e.g. RMS) and the transition band measurement to achieve balance between preservation of full band signal level or intended gain of the audio processing (full subband measurement) and perfect reconstruction characteristics (transition band measurement).

These features allow embodiments of the system and method to operate at low computational cost as compared to the cost of full high sampling rate audio processing, or to the cost of a QMF system with phase compensation filtering. In addition, using the novel transition band addition/subtraction method reduces amplitude distortion and aliasing noise in the reconstructed signal by a considerable amount.

It should be noted that alternative embodiments are possible, and steps and elements discussed herein may be changed, added, or eliminated, depending on the particular embodiment. These alternative embodiments include alternative steps and alternative elements that may be used, and structural changes that may be made, without departing from the scope of the invention.

DRAWINGS DESCRIPTION

Referring now to the drawings in which like reference numbers represent corresponding parts throughout:

FIG. 3 is a diagram illustrating the frequency response of the lower and upper frequency subbands in the 2-channel structure and the injection of multi-tone signals in the transition band that separates the lower and upper subbands.

FIG. 4 is a block diagram illustrating the analysis filter bank in polyphase representation of a 2-channel QMF bank.

FIG. 5 is a block diagram illustrating the synthesis filter bank in polyphase representation of a 2-channel QMF bank.

DETAILED DESCRIPTION

In the following description of embodiments of a multi-rate arbitrary audio processing system and method reference is made to the accompanying drawings. These drawings shown by way of illustration specific examples of how embodiments of the multi-rate arbitrary audio processing system and method may be practiced. It is understood that other embodiments may be utilized and structural changes may be made without departing from the scope of the claimed subject matter.

The existing techniques for off-line design of compensation filters for the high frequency subband(s) to correct the amplitude/phase changes caused by audio processing in the lowest frequency subband are unsuitable for a standalone system to be used with arbitrary audio processing. The compensation filters are designed and fixed based either on a priori knowledge of the audio processing or offline measurements of the induced amplitude/phase changes for each audio processing instantiation. Audio processing such as non-linear processing, linear time-variant processing or linear or non-linear processing having user set control parameters produce time-varying or undetermined amplitude and phase changes. The existing techniques do not adequately address such conditions. Furthermore, even with true linear audio processing, in which the amplitude and phase compensation should be fixed, existing techniques require a specific filter design for each audio processing technique.

The present techniques that provide for real-time measurement of the amplitude/phase changes in the transition band of the low subband caused by the audio processing and application of amplitude/phase compensation to the higher subband(s) are well suited for a standalone system to be used with arbitrary audio processing. The real-time measurement and compensation adapts to time-varying amplitude/phase changes regardless of the source of the change (e.g. non-linear, time-varying linear or user control parameters) and provides universal applicability for any linear audio processing.

The system details of components of embodiments of the multi-rate arbitrary audio processing system and method will now be discussed. It should be noted that only a few of the several ways in which the components, modules, and systems may be implemented are detailed below. Many variations are possible from that which is shown. For example, in some configurations the subband signals in each of the subbands are downsampled/upsampled. In other configurations, the subband signal in the lowest subband is downsampled to the sampling rate of the audio processing and then upsampled but the subband signals in the high or higher subband may or may not be downsampled/sampled. Either approach can be implemented in a QMF bank although a polyphase form of the QMF requires all of the subbands to be downsampled.

Figure 1:
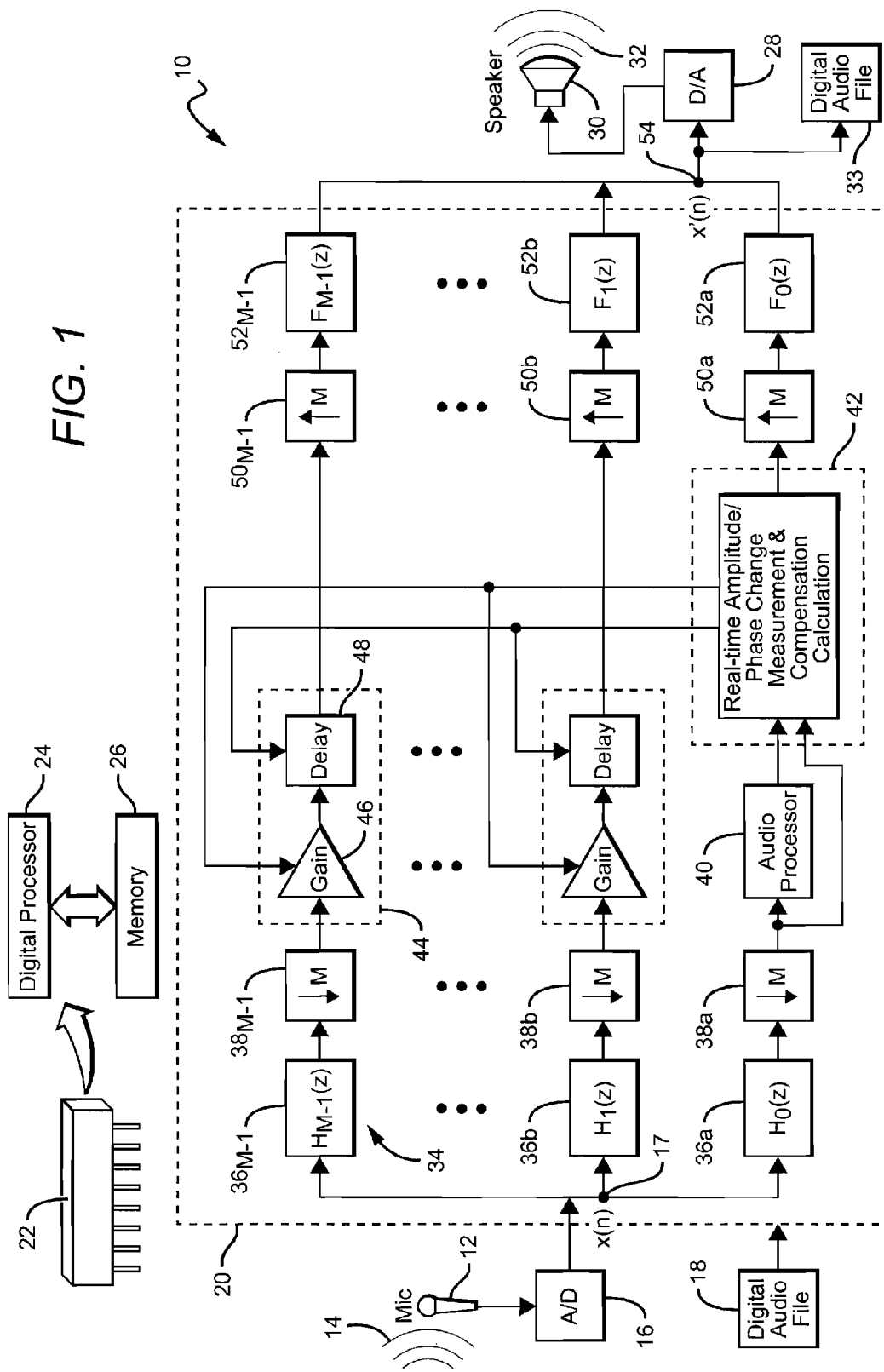
FIG. 1 is a block diagram of an embodiment of an M-channel Quadrature Mirror Filter (QMF) Bank Audio processing structure with a decimation/expansion ratio of M configured for real-time measurement and compensation of amplitude and phase changes caused by audio processing in the lowest frequency subband.

Referring now to FIG. 1, an embodiment of an audio reproduction system 10 includes a microphone 12 that converts sound 14 (pressure waves) into an analog signal and an analog-to-digital (A/D) converter 16 that samples the analog signal to produce a high sampling rate digital audio signal $x(n)$ 17 (mono, stereo or multi-channel). Sampling rates of 88.2 kHz, 96 kHz, 176.4 kHz and 192 kH being exemplary. Alternately, the digital audio signal can be pre-recorded and stored as a digital audio file 18. The high sampling rate digital audio signal is input to a multi-rate audio processing system 20 that implements subband decomposition, decimation, expansion and synthesis processes. Audio processing is applied to the downsampled audio signal in only the lowest subband. Typical sampling rates being 44.1 kHz and 48 kHz. Amplitude/phase changes caused by the audio processing are measured in real-time and compensation for such changes is applied to the higher subbands in real-time in a manner that is independent of the particular audio processing performed (i.e. non-linear, linear time-variant, control parameters or a specific linear design). The multi-rate audio processing system 20 may be implemented with one or more IC chips 22, each configured with one or more digital processors 24 and memory 26. The reconstructed digital audio signal x'(n) is passed through a digital-to-analog (D/A) converter 28 to produce an analog signal that drives a loudspeaker 30 to produce sound 32 (pressure waves). Alternately, the digital audio signal x'(n) can be stored as a digital audio file 33.

Multi-rate audio processing system 20 is implemented as an M-channel Quadrature Mirror Filter (QMF) bank audio processing structure 34 with a decimation/expansion ratio of M, where M is an integer value. Analysis filters $H_0(z)$, $H_1(z) \ldots H_{M-1}(z)$ 36a, 36b ... 36$_{M-1}$ decompose input digital audio signal x(n) into M frequency subbands, which overlap in a transition band, to generate M subband signals. Decimators 38a, 38b ... 38$_{M-1}$ decimate the respective subband signals to generate M downsampled subband signals.

An audio processor 40 performs audio processing on the downsampled subband signal in the lowest subband to generate a first processed signal. Typically, the subband signal is segmented into blocks of audio samples (e.g. 256, 512, 1024 samples) and each block is processed. Audio processing may constitute a linear process such as linear filtering—lowpass, highpass and bandpass filtering, which may be fixed or time-varying, a non-linear process such as dynamic range compression, limiter and modulation, or user control parameters such as graphic equalizer gain, processing enable/disable and filter cutoff frequency. The audio processing produces amplitude and phase changes to the downsampled audio signal in the transition band. The audio processing also imparts an intended gain on the signal for the full lowest frequency subband.

A compensation unit 42 measures in real-time amplitude and phase in the transition frequency band of the downsampled subband signal (before and after audio processing), processes the measurements to calculate a change in amplitude and phase in the transition frequency band and calculates both an amplitude compensation and a phase compensation for the remaining higher frequency subbands to approximately match the measured change in amplitude and phase in the lowest frequency subband. The amplitude compensation may be calculated based only on the change in amplitude in the transition band, in which case the compensation provides for perfect reconstruction of the output audio signal. Alternately, the amplitude compensation may be calculated based on the change in amplitude in both the transition band and the entire lowest frequency subband to balance perfect reconstruction of the output audio signal and preservation of the intended gain or signal level of the audio processing. The measurements and calculations are suitably performed in only the transition frequency band to enhance computational efficiency.

The amplitude and phase compensation are applied to each of the downsampled subband signals in the higher frequency subbands to generate processed subband signals. In an embodiment, the compensation is provided in the form of one or more compensation filters 44. In another embodiment, compensation is provided in the form of a single value gain 46 (amplitude compensation) and a single value delay 48 (phase compensation. In a filter configuration, additional delay is provided to compensate for processing latency of the audio processing. In the gain/delay configuration, the delay 48 includes both the group delay and the processing latency. In an M-channel implementation, the delay in each higher subband is an integer multiple of the calculated group delay plus the group delay of the filter banks. Amplitude/delay compensation is more computationally efficient whereas the compensation filter provides more precise amplitude and phase compensation.

For each block of processed audio samples, compensation unit 42 preferably determines whether there is sufficient amplitude and tonal content of the downsampled subband signal in the transition band of the lowest subband to reliably calculate the change in amplitude/phase, hence the amplitude/phase compensation. If the signal is too small or too noisy, the calculations are not valid. If this is the case, compensation unit 42 may be configured to implement various options. In one option, compensation unit 42 simply disables the calculation and application of amplitude/phase compensation until a strong tonal signal in the transition band is detected. In another option, compensation unit 42 disables the calculation of new amplitude/phase compensation and applies the last calculated amplitude/phase compensation until a strong tonal signal is detected. In yet another option, the compensation unit can insert one or more tone signals into the transition band of the downsampled subband signal for the lowest subband to create a strong tonal signal for measurement purposes. The one or more tone signals are then removed from the downsampled subband signal after audio processing. The tone signals are suitably selected to make minimal changes to the signal amplitude in the lowest frequency subband and to avoid canceling existing signal in the transition band. To provide clean tonal signals for measurement and processing, the compensation unit may remove the audio signal in the transition pre audio processing and re-insert the signal after audio processing. In an embodiment, this may be accomplished by performing a full FFT on the block of samples, removing the signal in the transition band and performing an inverse FFT.

After processing, expanders 50a, 50b, ... 50$_{M-1}$ expand the processed subband signals in the M channels by a factor of M. Synthesis filters $F_0(z), F_1(z) \ldots F_{M-1}(z)$ process the respective subband signals, which are recombined 54 to generate a digital audio output signal x'(n), which is either saved as a digital audio file or converted to sound.

Figure 2:
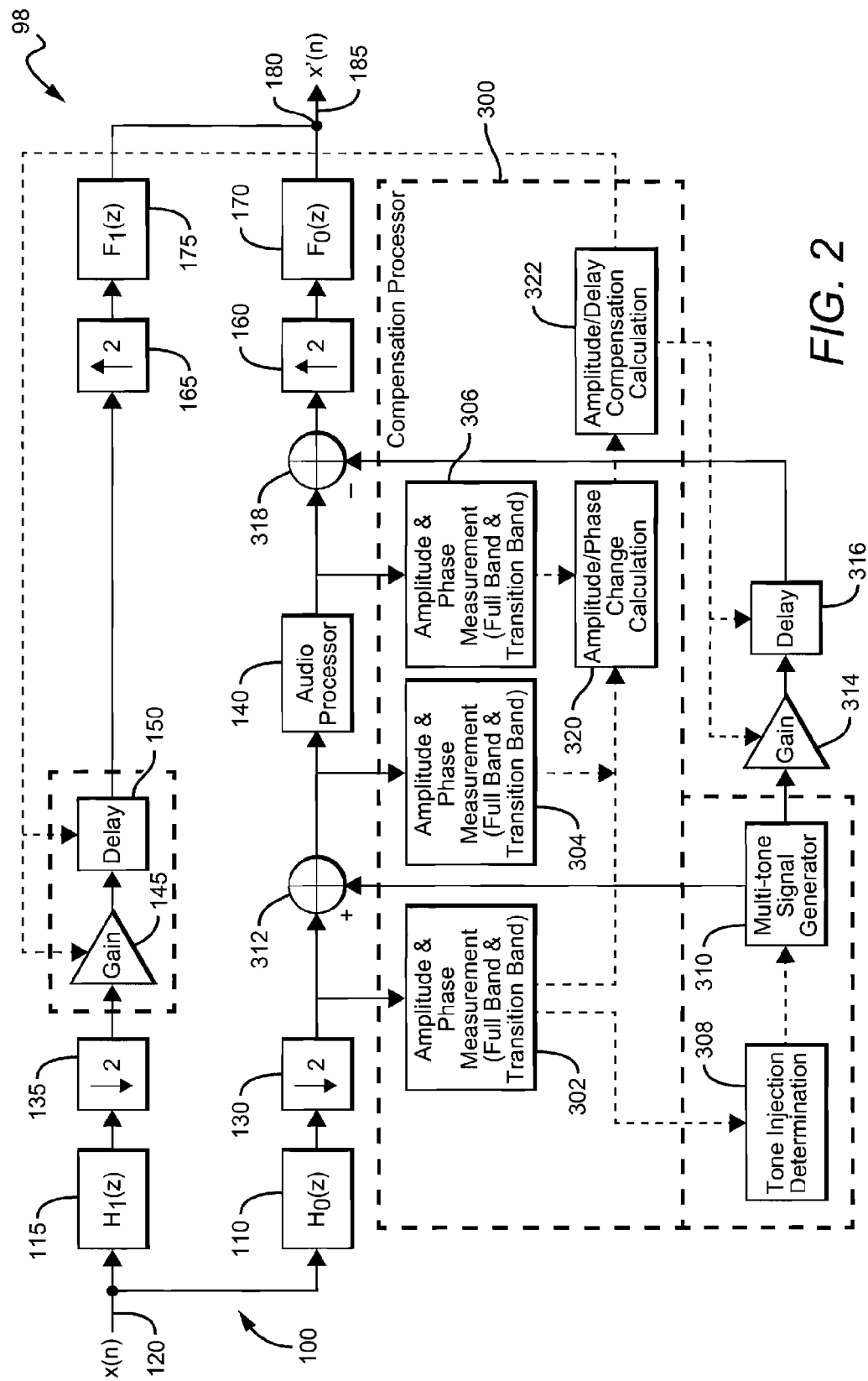
FIG. 2 is a block diagram of an embodiment of a 2-channel QMF Bank Audio processing structure in which real-time measurement and compensation is achieved by adding and then subtracting multi-tone signals into the lowest frequency subband before and after the audio processing.

Referring now to FIG. 2, an embodiment of a multi-rate audio processing system 98 is implemented as a two-channel Quadrature Mirror Filter Bank Audio processing structure 100 with a decimation/expansion ratio of 2. Following two analysis filters, $H_0(z)$ 110 and $H_1(z)$ 115, the input signal x(n) 120 is decimated 130, 135 by a factor of 2. If the system is maximally decimated the sampling rate of the subbands becomes the same as the sampling rate of the audio processing 140 and the audio processing 140 can be performed only in the low band. Gain, phase and latency compensations are required in the high band as the audio processing 140 in the low band can introduce amplitude/phase changes as well as delay. In this embodiment, gain compensation 145 and delay compensation 150 (phase (group delay) and latency) are applied to the high subband. The processed subband signals are expanded 160, 165 by a factor of 2, processed with synthesis filters $F_0(z)$ 170 and $F_1(z)$ 175, and recombined 180 to generate a digital audio signal x'(n) 185.

As shown in FIG. 3, the analysis filters $H_0(z)$ 110 and $H1(z)$ 115 and synthesis filters $F_0(z)$ 170 and $F_1(z)$ 175 are lowpass and highpass filters, respectively, with crossover frequency at $\pi/2$. The lowpass filter has a pass band 187, a transition band 188 centered at the crossover frequency and a stop band 189. The highpass filter has a stop band 190, a transition band 191 centered at the crossover frequency and a pass band 192.

Mathematically, the relationship between analysis filters $H_0(z)$ 110 and $H_1(z)$ 115 can be described as, $$H_1(z)=H_0(-z) \qquad (1).$$

In order to cancel aliasing, the synthesis filters $F_0(z)$ 170 and $F_1(z)$ 175 need to meet the following conditions:

$$F_0(z)=F_1(z)=-H_0(-z) \qquad (2).$$

Equations (1) and (2) indicate that aliasing free analysis and synthesis filters can be designed from a single filter $H_0(z)$ 110.

Representing Quadrature Mirror Filter (QMF) banks in polyphase form offers computational benefits. Polyphase representation is a method that separates filter coefficients into multiple groups. For a ratio of 2, the even numbered filter coefficients are separated from the odd numbered ones. Using polyphase representation, the analysis filter $H_0(z)$ 110 can be written as, $$H_0(z)=E_0(z^2)+z^{-1}E_1(z^2) \qquad (3).$$

Using equations (1), (2) and (3), equations (4) and (5) are obtained as follows:

$$\begin{bmatrix} H_0(z) \\ H_1(z) \end{bmatrix} = \begin{bmatrix} 1 & 1 \\ 1 & -1 \end{bmatrix} \begin{bmatrix} E_0(z^2) \\ z^{-1}E_1(z^2) \end{bmatrix} \qquad (4)$$

$$\begin{bmatrix} F_0(z) \\ F_1(z) \end{bmatrix} = \begin{bmatrix} 1 & 1 \\ 1 & -1 \end{bmatrix} \begin{bmatrix} z^{-1}E_1(z^2) \\ E_0(z^2) \end{bmatrix}. \qquad (5)$$

If the decimation/expansion ratio is 2, $E_0(z^2)$ and $E_1(z^2)$ in equations (4) and (5) can be transposed using decimation and interpolation noble identities. They then become $E_0(z)$ and $E_1(z)$. This results in the corresponding filters operating at the lower rate. FIG. 4 is a block diagram illustrating the analysis filter bank 110, 115 in polyphase representation of the QMF banks. FIG. 5 is a block diagram illustrating the synthesis filter bank 170, 175 in polyphase representation of the QMF banks.

The polyphase representation of QMF can be expanded to a multi-resolution structure to achieve a maximally decimated system. The signal is decimated and divided into two subbands, and the same process is applied to the low band signal. As audio processing is only performed in the lowest band, the high band of the first subband does not require subband processing. The terms, $E_0(z)$ and $E_1(z)$, in FIGS. 4 and 5 are replaced with allpass filters $A_0(z)$ and $A_1(z)$ given the power symmetric filter design described above. The terms $A_0(z)/A_1(z)$ and $A'_0(z)/A'_1(z)$ may not be the same filters subject to the design requirements of the system.

In addition to aliasing cancellation, it is also desirable to prevent amplitude distortion when reconstructing the signal. If $E_0(z)$ 200 and $E_1(z)$ 205 in FIGS. 4 and 5 are Infinite Impulse Response (IIR) allpass filters, this source of amplitude distortion is eliminated. The two allpass filters for $E_0(z)$ 200 and $E_1(z)$ 205 are obtained by designing the analysis filter $H_0(z)$ 110 to be a power symmetric filter and decomposing it into two allpass filters.

Power symmetric IIR halfband filters satisfy the following two conditions:

$$\omega_p+\omega_s=\pi \qquad (6)$$

$$\delta_p=1-\sqrt{1-\delta_s^2} \qquad (7).$$

Butterworth filters designed with cutoff frequency $\omega_c=0.5\pi$ satisfy the power symmetric conditions. Elliptic filters can also meet the conditions given in equations (6) and (7), but their parameters need to be adjusted. The power symmetric elliptic filter design process is described in detail in Chapter 7 ("Lth-band digital filters") of the book "Multirate Filtering for Digital Signal Processing MATLAB Applications" by Ljiljana Milic, New York, Information Science Reference, pages 206-237 (2009). Because the poles of power symmetric elliptic filters are located on the imaginary axis of the complex plane, the allpass filters for $E_0(z)$ 200 and $E_1(z)$ 205 are obtained using the pole interlacing property, which is described in Chapter 5 ("Maximally Decimated Filter Banks") of the book "Multirate Systems and Filter Banks" by P. P. Vaidyanathan, New Jersey, PTR Prentice-Hall, Inc., pages 188-256 (1993).

Embodiments of the multi-rate arbitrary audio processing system and method are free of aliasing noise and amplitude distortion in part because they include a QMF system design with power symmetric filters. However, aliasing noise and amplitude distortion can be introduced as a result of applying audio processing to the low subband. Even with amplitude and phase compensations made to the higher subbands to compensate for the changes induced by low band processing it may not be possible to eliminate amplitude distortion and aliasing noise completely. Therefore, it is desirable to have a narrow transition band with high stopband attenuation in order to minimize the region that contains amplitude distortion and aliasing noise.

In some embodiments of multi-rate arbitrary audio processing system and method the design criteria for the analysis filter $H_0(z)$ 110 in a 2:1 ratio decimation/expansion system are: (a) a stopband attenuation of 96 dB or higher; and (b) a transition bandwidth of $0.4167\pi$ to $0.5833\pi$.

The passband edge frequency $0.4167\pi$ is equivalent to 20 kHz at 48 kHz sampling rate. Therefore, if aliasing noise and amplitude distortion exist, they become present in the frequency range above human hearing. As analysis filters $H_0(z)$ 110 and $H_1(z)$ 115 are a mirror image of each other, amplitude distortion and aliasing noise will be less than −96 dBFs with the stopband attenuation criterion set above. Embodiments of the multi-rate arbitrary audio processing system and method include an optimal power symmetric filter that meets the filter design criteria.

In different embodiments, 13th order half band Butterworth and elliptic filters have a passband edge at $0.4167\pi$. The Butterworth filter attenuation is higher than that of the elliptic filter above $0.78\pi$ because of its monotonicity in the stopband. However, the Butterworth filter involves a filter order increase in order to reduce the transition bandwidth. Therefore, elliptic filters are more suitable and were used in embodiments of the multi-rate arbitrary audio processing system and method given their lower filter order requirement for the transition bandwidth criterion described above.

Given the choice of elliptic filter design some tradeoffs need to be considered. These are tradeoffs between transition bandwidth and stopband attenuation, and filter order and ripple size respectively. A smaller transition band results in lower stopband attenuation. Increasing the filter order can produce higher stopband attenuation, but it will increase the ripple size and also the computational cost. The optimal design for the given filter design criteria is a $13^{th}$ order elliptic filter with passband edge $0.42\pi$. Using the allpass decomposition described above, $E_0(z)$ and $E_1(z)$ in FIGS. 4 and 5 are $3^{rd}$ order allpass filters for a $13^{th}$ order elliptic filter.

Referring again to FIG. 2, in order to compensate the higher subbands for the amplitude, phase and delay caused by audio processing in the lowest subband, real-time measurements of the amplitude and phase of the signal in the lowest frequency subband must be made and processed to determine whether the audio signal itself has sufficient tonal content and signal strength in the transition band to reliably determine the compensation and, if not what tone signals to inject, calculate the change in amplitude in phase caused by audio processing and to calculate the amplitude and phase compensation for the higher subbands in the form of either compensation filter(s) plus delay (processing latency) or a single gain value and a single delay value (group delay plus processing latency). Amplitude and phase compensation is not required in the full bandwidth of the signal, only in the transition band. A compensation processor(s) 300 is configured to implement the measurement, control and calculation techniques to provide in real-time the gain and phase compensation. In an embodiment, processor 300 processes the each block of samples (processed by the audio processing) to provide updated gain and phase compensation for each block.

Compensation processor(s) 300 are suitably configured to make real-time measurements of amplitude and phase of the signal in the lowest frequency subband (full band and transition band) pre- and post-injection of tone signals 302 and 304 and post audio processing 306. The full band amplitude can be calculated as the root-mean-square (RMS) of the audio signal samples x(n) in the lowest frequency subband for each processed block of samples. The transition band amplitude can be calculated as the average of Discrete Fourier Transform coefficients over the transition band. To improve computational efficiency a Goertzel algorithm can be used to compute the DFT coefficients. The Goertzel algorithm has the form of a digital filter that provides the DFT value of a given frequency. The phase of the signal can be calculated by taking the inverse tangent of the imaginary part of the DFT term divided by the real part.

Compensation processor(s) 300 are configured to process the full and transition band amplitude and phase measurements to determine whether to inject one or more tone signals into the transition band of the audio signal in the lowest frequency subband and, if so, the proper amplitude, phase and frequency of the tone signals 308. If the signal has sufficient amplitude and tonal content in the transition band, injection of tone signals is not necessary. If tone signals are to be injected, the processor 300 sets the amplitude of the one or more tone signals to be higher than a noise signal in the transition band but low enough to make minimal change to the amplitude in the full first frequency subband and sets the phase and frequency of the one or more tone signals to avoid cancellation of the first downsampled subband signal in the transition band. The processor(s) are configured to implement a multi-tone signal generator 310 that injects the one or more tone signals at a summing node 312 to add the tone signals to the audio signal in the lowest frequency subband.

These tone signals are suitably single frequency discrete sine waves. Mathematically, the signal added to the low band before processing, and the cancellation signal intended for subtracting the signal added are given by $$a(n) = \beta \sum_{k=\rho}^{N/2} \cos\left(2\pi n\left(\frac{k}{N}\right)\right) \quad (8)$$

$$c(n) = -\beta \sum_{k=\rho}^{N/2} \delta_{mag}(k)\cos\left(2\pi n\left(\frac{k}{N}\right) + \delta_{phase}(k)\right) \quad (9)$$

where, $\rho$ is set to $N/2-1$ as the real-time amplitude and phase compensation implementation only involves the group delay measurement at the Nyquist frequency. Still, $\rho$ can be set to the DFT point of the passband edge frequency of the low band filter $H_0(z)$ in order to exploit the full transition band amplitude/phase information. The signal amplitude $\beta$ is determined by the first measurement of the low band signal before the audio processing 140. The terms $\delta_{mag}(k)$ and $\delta_{phase}(k)$ are magnitude and phase (k) differences calculated from the measurements before and after the audio processing. As depicted in FIG. 2, gain 314 and delay 316 are applied to the tone signals, which are removed from the audio signal in the lowest frequency subband at summing node 318. The signal added for the measurement may not be cancelled out completely since there can be amplitude/phase measurements error and round off error introduced by the system.

Compensation processor(s) 300 are configured to calculate the change in amplitude and phase in both the full band and transition band caused by the audio processing 320. The change in the amplitude may be expressed as a ratio of the post-processing amplitude to the pre-processed amplitude. The change in phase may be expressed as the difference between the post and pre-processed phase measurements. The change in amplitude and phase is computed for each tone signal or at one or more frequencies across the transition band (if tones are not injected)

Compensation processor(s) 300 are configured to calculate the amplitude and phase compensation for the higher subbands to approximately match the measured change in amplitude and phase 322. As shown, the processor(s) calculate a single gain value to set gain 145 and a single delay value (both group delay and processing latency) to set delay 150 to apply the compensation to the signals in the higher frequency subbands. Alternately, the processors may calculate a full compensation filter(s) whose frequency response approximately matches the frequency response in the transition band of the audio processing.

Applying root mean square (RMS) value changes of the low-band signal to the high-band signal may satisfy the amplitude compensation requirement in terms of maintaining constant full band signal level, but it may not accomplish perfect reconstruction of the signal in the QMF system of embodiments of the multi-rate arbitrary audio processing system and method. As amplitude information of the signal in the transition band of the QMF system is obtained from the Goertzel algorithm, it can be used to calculate amplitude changes in the transition band of the low band signal.

Equations (10) and (11) below show mathematically the comparison of RMS value changes and transition band level changes in order to achieve a reasonable balance between preservation of full band signal level and perfect reconstruction characteristics.

$$y_h(n) = m_{coef} x_h(n) \quad (10)$$

$$m_{coef} = f(m_{\delta tr}, m_{\delta RMS}),$$

$$f(m_{\delta tr}, m_{\delta RMS}) = G(d_{\delta rms\_tr}, \tau), \quad (11)$$

$$d_{\delta rms\_tr} = m_{\delta RMS}(dB) - m_{\delta tr}(dB),$$

where $m_{coef}$ is the actual amplitude compensation value applied to the high band of the QMF system. $f(m_{\delta tr}, m_{\delta RMS})$ is a function that calculates the amplitude compensation value based on the transition band amplitude change ($m_{\delta tr}$) and the lowest frequency subband change ($m_{\delta RMS}$). This function $f()$ can be interpreted as function G() that takes inputs of the amplitude change difference–$d_{\delta rms\_tr}$ and a target threshold to determine the balance between the transition band and the first frequency subband. Function G( ) can be designed in many ways to address particular concerns for given applications. Equation (12) is an example of function G()

$$G(d_{\delta rms\_tr}, \tau) = \begin{cases} m_{\delta tr}, & d_{\delta rms\_tr} < \tau_1 \\ (m_{\delta tr} + m_{\delta RMS})/2, & \tau_2 > d_{\delta rms\_tr} > \tau_1 \\ m_{\delta RMS}, & d_{\delta rms\_tr} > \tau_2 \end{cases} \quad (12)$$

In this example, the threshold r is a set of two thresholds $\tau_1$ and $\tau_2$. In addition to the threshold settings, a smoothing algorithm is applied to $M_{coef}$ in a real-time implementation in order to ensure smooth amplitude transition over time.

Figure 6:
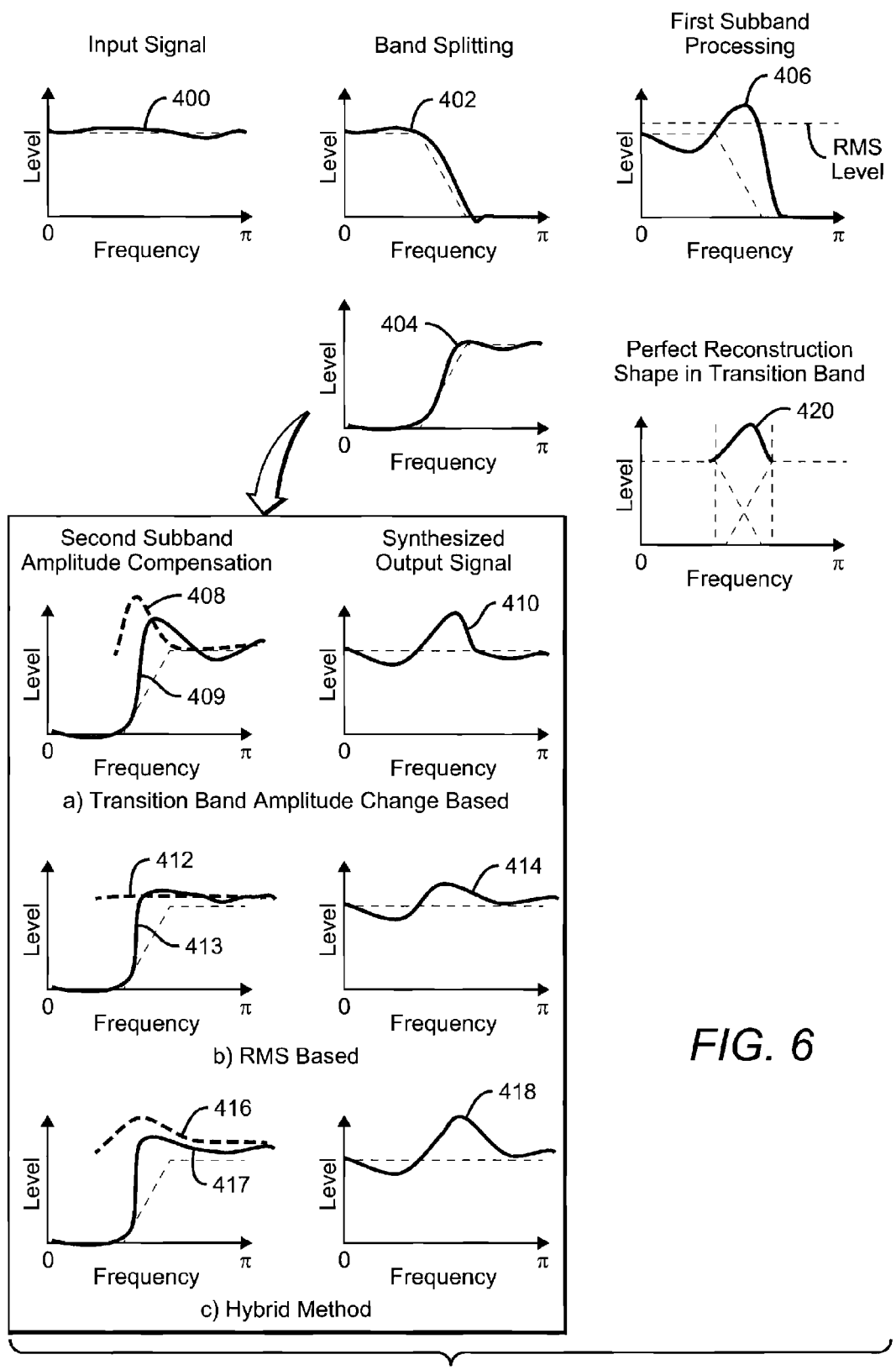
FIG. 6 is a diagram illustrating the real-time amplitude compensation based on a comparison of amplitude measurements in the transition band and across the full lowest frequency subband.

Referring now to FIG. 6, an input signal 400 is split into lower and upper frequency subbands 402 and 404, respectively. Audio processing is performed on the signal in the lower frequency subband to produce a processed subband signal 406. In this example, compensation is provided by a filter, hence may vary across the transition band. Amplitude compensation is applied to signal 404 in the higher frequency subband in one of three ways. First, amplitude compensation 408 is computed based only on the amplitude change in the transition band and applied to signal 404 to produce compensated signal 409. As shown in the corresponding synthesized output signal 410, this approach provides perfect reconstruction as shown in 420, but does not maintain the full band signal level (gain of audio processing) shown in 406. Second, amplitude compensation 412 is computed based only on the RMS value for the full band and applied to signal 404 to produce compensated signal 413. As shown in the corresponding synthesized output signal 414, this approach maintains the full band signal level (gain of audio processing) as shown in 406 but does not provide perfect reconstruction. Lastly, amplitude compensation 416 is computed using equation 11 to balance perfect reconstruction and full band signal level and applied to signal 404 to produce compensated signal 417. This balance is achieved as shown in the synthesized output signal 418.

As magnitude and phase response of the transition band for compensation are known from measurements and calculation, one can design a filter or filters given magnitude and phase response. Alternatively, one can design separate filters for magnitude matching and phase matching. Number of tones added to the transition band determines the frequency resolution of the transition band. When designing compensation filter(s) the magnitude and phase response may need interpolations if the frequency resolution is lower than it is required for the filter design. Often, the term phase compensation is considered to be the same as the group delay compensation. However, group delay can be measured not just using adjacent frequency bins but frequency bins with bigger intervals. Therefore, group delay can be an approximation of phase change given frequency resolution.

While there are various methods available for group delay measurements of discrete time signals, embodiments of the multi-rate arbitrary audio processing system and method use the direct differentiation method. The direct differentiation method calculates the derivative of the unwrapped phase of the signal. Mathematically this can be written as:

$$\tau_g = -\frac{d\phi(\omega)}{d\omega}. \quad (13)$$

Phase changes caused by arbitrary audio processing in the low band of the QMF are measured using the Goertzel algorithm. The group delay at the Nyquist frequency is then calculated and rounded to the nearest integer value due to its greater amount of squared-magnitude overlap between the low and high bands in the QMF system. If arbitrary audio processing in the lowest subband of the QMF system introduces latency, the signal in the higher subbands must also be delayed to match the latency introduced in the lowest subband. Since the delay block needs to be there for latency compensation, the integer number group delay compensation method adds no additional computation but a small amount of memory.

With one pure sine wave tone, we cannot do group delay matching as it requires two DFT components to calculate group delay. But with one tone we can do phase matching at Nyquist frequency as Nyquist frequency phase change will always appear to be 0 degrees or 180 degrees.=>0 degrees: no compensation, 180 degrees: 1-sample delay to make it 0 degrees.

Considering that a 1-sample delay at the Nyquist frequency is equivalent to a 180-degree phase shift for discrete time signals, an odd number group delay will cause a 180-degree phase shift at the Nyquist frequency in the high band of the QMF system. As power symmetric elliptic filters have a 90-degree phase difference between the low band and the high band at the Nyquist frequency, adding an odd number group delay does not cancel out the signals at Nyquist but changes the polarity of the signals in the reconstruction phase.

However, the phase difference between the aliasing noise of the QMF system in the low band and that in the high band is 180 degrees. As such, the aliasing noise is cancelled out in the reconstruction phase. Therefore, adding an odd number group delay in the high band can actually increase the aliasing noise and amplitude distortion. Consequently, it is important to check the phase response change at Nyquist.

For example, for a 0-degree phase shift and an odd number group delay at Nyquist frequency, the group delay value should be rounded to the nearest even number integer value instead of the nearest integer number if the Nyquist frequency has a 0-degree phase shift and odd number group delay.

Figure 7:
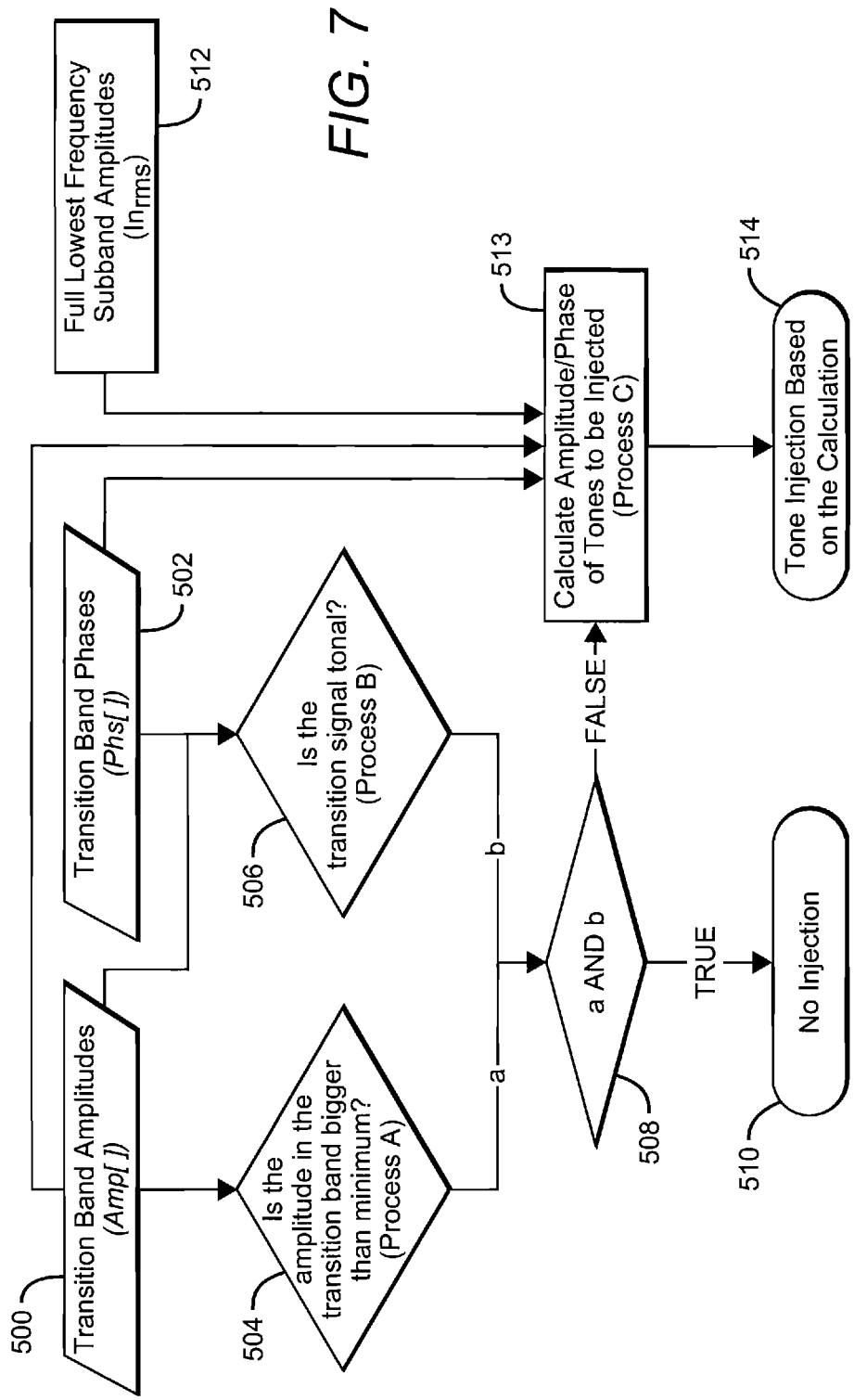
FIG. 7 is a flow diagram illustrating the decision process for injecting tone signals into the transition band and the calculation of the amplitude/phase of the tone signals.

Referring now to FIG. 7, an embodiment of step 308, tone injection determination, in FIG. 2 first determines whether or not to inject tone signals in the transition band of the lowest frequency subband and, if yes, the amplitude and phase of the injected tones. The compensation processor is configured to determine whether the downsampled signal in the transition band of the lowest frequency subband has both sufficient amplitude and sufficient tonal content to compute the amplitude and phase compensation. If not, the compensation processor is configured to determine the amplitude of the tone signals to be higher than a noise signal in the transition band but low enough to make minimal change to the amplitude in the full lowest frequency subband. The compensation processor is configured to select the phase and frequency of the tones signals to avoid cancellation of the downsampled signal in the transition band.

In an embodiment, the compensation processor is configured to implement three processes: Process A, Process B and Process C to determine whether to inject tone signals and if so the amplitude and phase of the tone signals. The compensation processor is configured to receive transition band amplitudes (Amp[ ]) 500 and transition band phases (Phs[ ]) 502 for the current block of processed samples.

The compensation processor is configured to process the transition band amplitudes to determine whether the amplitude in the transition band is greater than a minimum 504 (Process A). An example of Process A computes: Minimum amplitude(a) $>(-6*B_{sys})(dB)+E_{rnd}$ (dB) where $B_{sys}$=system bit resolution (ex—32 bit, 24 bit, 16 bit etc) and $E_{rnd}$=Round-off error from calculation and Minimum amplitude (a) is the minimum amplitude in transition band. In this example, the minimum amplitude required to calculate the amplitude/phase compensation is the sum of the minimum signal value for system bit resolution in dB and the expected round-off error from the amplitude/phase calculation.

The compensation processor is configured to process the transition band amplitudes to determine whether the transition band is tonal 506 (Process B). An example of Process B computes spectral flatness of the transition band to determine whether the magnitude spectrum is likely to contain tonal components. The process measures the phase variation of each frequency in the transition band to measure the phase continuities that can distinguish noise signal from tonal signal. By combining spectral flatness and phase variation one can determine if the signal contains tonal signal at a given frequency bin within the transition band. For example, $Tonal(k)$ = True, Delta_p(k) < Treshold_p &
    Spectral flatness(k) > Trehosld_sf
= False, Delta_p(k) > Treshold_p ||
    Spectral flatness(k) < Trehosld_sf Treshold_p = phase variation threshold Treshold_s = spectral flatness threshold Spectral flatness(k) = $Pl(k)/Avr$, where $k$ = 1 ... m, m = number of peaks, calculated using Amp[ ]

$Pl(1, 2, ... m)$ = Levels of spectral peaks in the transition band, , (m < n, m = number of peaks in the transition band, n = number of transition band frequency bins)

Avr = average level of the transition band amplitude.

Delta_p(k) = Delta_p1(k) − Delta_p0(k), :phase variation (k = 1, 2, ... m), calculated using Phs[ ]

Delta_p0(k) = abs(Phs[k] − Phs[k − 1]), and

Delta_p1(k) = abs(Phs[k + 1] − Phs[k]).

If the transition band signal has both sufficient amplitude and tonal content (L.e. Process A and Process B are both "true") 508, the compensation processor does not inject tone signals 510 and processes the transition band signal to determine the amplitude and phase compensation. If the transition band signal lacks either sufficient amplitude or tonal content (i.e., Process A or Process B is "false") 508, the compensation processor is configured to process the transition band amplitudes, transition band phases and the full lowest frequency subband amplitudes 510 to calculate the amplitude/phase of the tones to be injected 512 and inject the tones into the transition band 514.

In an example, the compensation processor is configured to set the minimum change of signal level, and calculate a minimum level of tone(s) using the full band amplitude of the input signal. For example Find a minimum $x_{rms}$ meets the requirement of 20 $\log_{10}$ $(In_{rms}+x_{rms}/In_{rms})<\tau(dB)$ Where $In_{rms}$=measured value of the lowest frequency subband amplitude and $x_{rms}$=the level of the tone to be injected.

Case1(a = true, b = false): amplitude is bigger but noise $\tau$ = tone_noise_ratio: tone signal to noise ratio Case2(a = false, b = true): amplitude is smaller but tonal $\tau$ = min_level: the minimum level change threshold in Case2

Case3(a = false, b = false): amplitude is smaller and noise calculate $X_{rms}$ for both $\tau$ = 'min_level' and $\tau$ = 'tone_noise_ratio' and, $X_{rms} = X_{rms}$(min_level), if $X_{rms}$(min_level) > $X_{rms}$(tone_noise_ratio)

= $X_{rms}$(tone_noise_ratio), if $X_{rms}$(min_level) < $X_{rms}$(tone_noise_ratio).

Figure 8:
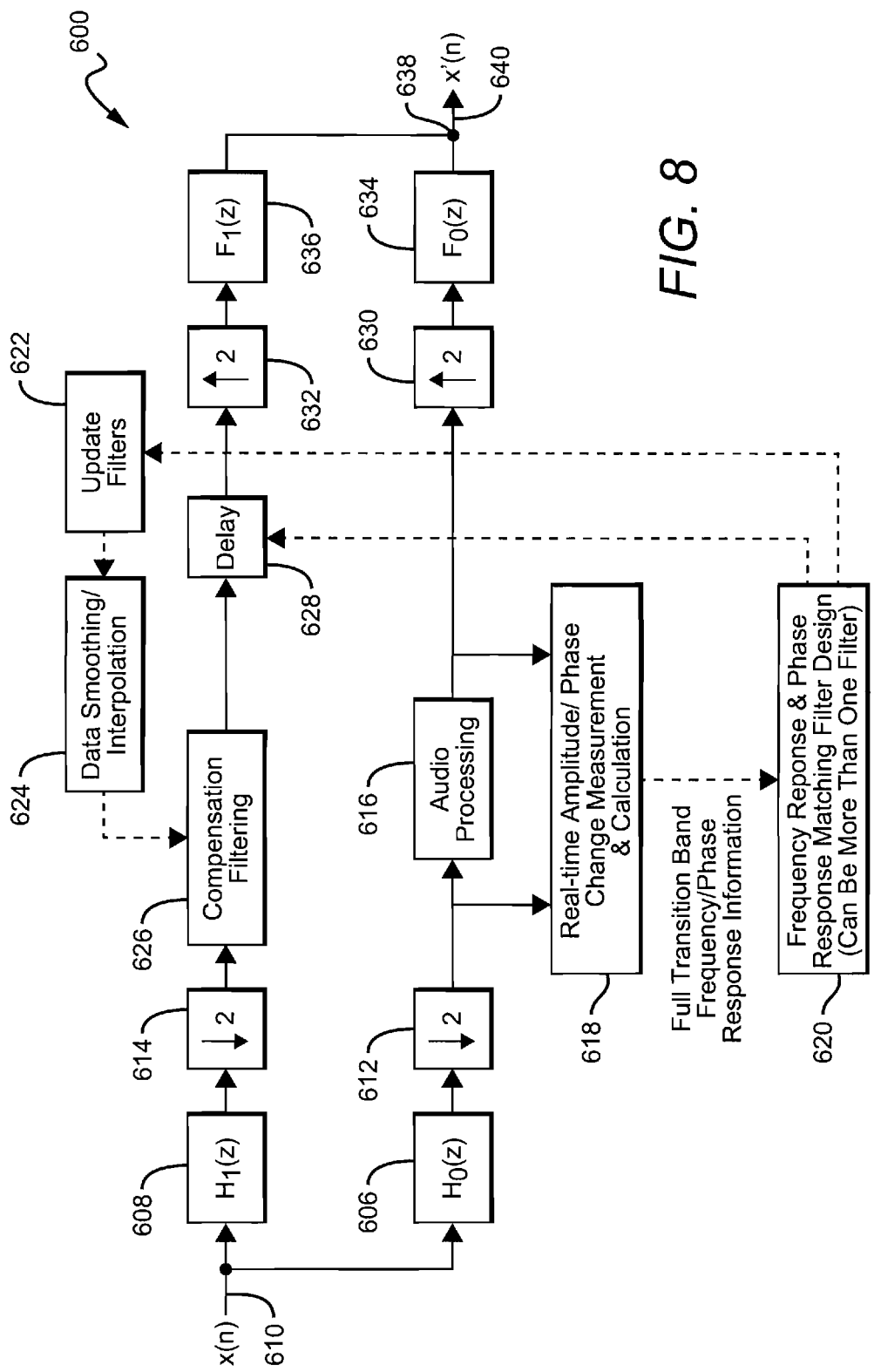
FIG. 8 is a block diagram of an embodiment of a 2-channel QMF Bank Audio processing structure in which real-time measurement is used to update a compensation filter(s) for the higher frequency subbands.

Referring now to FIG. 8, an embodiment of a multi-rate audio processing system 600 is implemented as a two-channel Quadrature Mirror Filter Bank audio processing structure with a decimation/expansion ratio of 2. In this embodiment, the amplitude/phase compensation in the higher frequency subband is performed using one or more compensation filters. Compensation filters provide better matching of the amplitude and phase changes induced in the transition band by the audio processing at the cost of additional computations.

Following two analysis filters, $H_0(z)$ 606 and $H_1(z)$ 608, the input signal x(n) 610 is decimated 612 and 614 by a factor of 2. Audio processing 616 is performed on a block of samples of the downsampled input signal x(n). The amplitude/phase of the downsampled signal x(n) are measured before and after audio processing and processed 618 to calculate a change in the amplitude and phase of the signal in the transition band caused by the audio processing to provide full transition band frequency/phase response information. One or more compensation filters are designed 620 from this information to provide a filter response that approximately matches the frequency/phase response in the transition band. FIR or IIR filters can be used for designing filters given magnitude (amplitude) and phase characteristics. It can be a same filter set that approximately matches the amplitude and phase response, or separate filter sets for the amplitude matching and the phase matching. These designs are used to update the filters 622. Data smoothing/interpolation 624 is applied to the updated filters to prevent any artifacts that can be caused by updating filters or filter coefficients. These interpolated/smoothed filters are applied to the state variables of the filter processing in the highest frequency subband to provide amplitude and phase compensation 626. Delay 628 provides compensation for the processing latency of the audio processing. The processed subband signals are expanded 630 and 632 by a factor of 2, processed with synthesis filters $F_0(z)$ 634 and $F_1(z)$ 636, and recombined 638 to generate a digital audio signal x'(n) 640.

Many other variations than those described herein will be apparent from this document. For example, depending on the embodiment, certain acts, events, or functions of any of the methods and algorithms described herein can be performed in a different sequence, can be added, merged, or left out altogether (such that not all described acts or events are necessary for the practice of the methods and algorithms). Moreover, in certain embodiments, acts or events can be performed concurrently, such as through multi-threaded processing, interrupt processing, or multiple processors or processor cores or on other parallel architectures, rather than sequentially. In addition, different tasks or processes can be performed by different machines and computing systems that can function together.

The various illustrative logical blocks, modules, methods, and algorithm processes and sequences described in connection with the embodiments disclosed herein can be implemented as electronic hardware, computer software, or combinations of both. To clearly illustrate this interchangeability of hardware and software, various illustrative components, blocks, modules, and process actions have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of this document.

The various illustrative logical blocks and modules described in connection with the embodiments disclosed herein can be implemented or performed by a machine, such as a general purpose processor, a processing device, a computing device having one or more processing devices, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor and processing device can be a microprocessor, but in the alternative, the processor can be a controller, microcontroller, or state machine, combinations of the same, or the like. A processor can also be implemented as a combination of computing devices, such as a combination of a DSP and a microprocessor, a plurality of microprocessors, one or more microprocessors in conjunction with a DSP core, or any other such configuration.

Embodiments of the multi-rate arbitrary audio processing system and method described herein are operational within numerous types of general purpose or special purpose computing system environments or configurations. In general, a computing environment can include any type of computer system, including, but not limited to, a computer system based on one or more microprocessors, a mainframe computer, a digital signal processor, a portable computing device, a personal organizer, a device controller, a computational engine within an appliance, a mobile phone, a desktop computer, a mobile computer, a tablet computer, a smartphone, and appliances with an embedded computer, to name a few.

Such computing devices can be typically be found in devices having at least some minimum computational capability, including, but not limited to, personal computers, server computers, hand-held computing devices, laptop or mobile computers, communications devices such as cell phones and PDA's, multiprocessor systems, microprocessor-based systems, set top boxes, programmable consumer electronics, network PCs, minicomputers, mainframe computers, audio or video media players, and so forth. In some embodiments the computing devices will include one or more processors. Each processor may be a specialized microprocessor, such as a digital signal processor (DSP), a very long instruction word (VLIW), or other micro-controller, or can be conventional central processing units (CPUs) having one or more processing cores, including specialized graphics processing unit (GPU)-based cores in a multi-core CPU.

The process actions of a method, process, or algorithm described in connection with the embodiments disclosed herein can be embodied directly in hardware, in a software module executed by a processor, or in any combination of the two. The software module can be contained in computer-readable media that can be accessed by a computing device. The computer-readable media includes both volatile and nonvolatile media that is either removable, non-removable, or some combination thereof. The computer-readable media is used to store information such as computer-readable or computer-executable instructions, data structures, program modules, or other data. By way of example, and not limitation, computer readable media may comprise computer storage media and communication media.

Computer storage media includes, but is not limited to, computer or machine readable media or storage devices such as Blu-ray discs (BD), digital versatile discs (DVDs), compact discs (CDs), floppy disks, tape drives, hard drives, optical drives, solid state memory devices, RAM memory, ROM memory, EPROM memory, EEPROM memory, flash memory or other memory technology, magnetic cassettes, magnetic tapes, magnetic disk storage, or other magnetic storage devices, or any other device which can be used to store the desired information and which can be accessed by one or more computing devices.

A software module can reside in the RAM memory, flash memory, ROM memory, EPROM memory, EEPROM memory, registers, hard disk, a removable disk, a CD-ROM, or any other form of non-transitory computer-readable storage medium, media, or physical computer storage known in the art. An exemplary storage medium can be coupled to the processor such that the processor can read information from, and write information to, the storage medium. In the alternative, the storage medium can be integral to the processor. The processor and the storage medium can reside in an application specific integrated circuit (ASIC). The ASIC can reside in a user terminal. Alternatively, the processor and the storage medium can reside as discrete components in a user terminal.

The phrase "non-transitory" as used in this document means "enduring or long-lived". The phrase "non-transitory computer-readable media" includes any and all computer-readable media, with the sole exception of a transitory, propagating signal. This includes, by way of example and not limitation, non-transitory computer-readable media such as register memory, processor cache and random-access memory (RAM).

The phrase "audio signal" is a signal that is representative of a physical sound.

Retention of information such as computer-readable or computer-executable instructions, data structures, program modules, and so forth, can also be accomplished by using a variety of the communication media to encode one or more modulated data signals, electromagnetic waves (such as carrier waves), or other transport mechanisms or communications protocols, and includes any wired or wireless information delivery mechanism. In general, these communication media refer to a signal that has one or more of its characteristics set or changed in such a manner as to encode information or instructions in the signal. For example, communication media includes wired media such as a wired network or direct-wired connection carrying one or more modulated data signals, and wireless media such as acoustic, radio frequency (RF), infrared, laser, and other wireless media for transmitting, receiving, or both, one or more modulated data signals or electromagnetic waves. Combinations of the any of the above should also be included within the scope of communication media.

Further, one or any combination of software, programs, computer program products that embody some or all of the various embodiments of the multi-rate arbitrary audio processing system and method described herein, or portions thereof, may be stored, received, transmitted, or read from any desired combination of computer or machine readable media or storage devices and communication media in the form of computer executable instructions or other data structures.

Embodiments of the multi-rate arbitrary audio processing system and method described herein may be further described in the general context of computer-executable instructions, such as program modules, being executed by a computing device. Generally, program modules include routines, programs, objects, components, data structures, and so forth, which perform particular tasks or implement particular abstract data types. The embodiments described herein may also be practiced in distributed computing environments where tasks are performed by one or more remote processing devices, or within a cloud of one or more devices, that are linked through one or more communications networks. In a distributed computing environment, program modules may be located in both local and remote computer storage media including media storage devices. Still further, the aforementioned instructions may be implemented, in part or in whole, as hardware logic circuits, which may or may not include a processor.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

Moreover, although the subject matter has been described in language specific to structural features and methodological acts, it is to be understood that the subject matter defined in the appended claims is not necessarily limited to the specific features or acts described above. Rather, the specific features and acts described above are disclosed as example forms of implementing the claims.

The invention claimed is:

1. A method of audio reproduction, comprising:
splitting a first digital audio signal into at least a first and a second frequency subbands to generate at least a first and a second subband signal, said first and second frequency subbands separated by a transition frequency band;
generating a first downsampled subband signal by downsampling or decimating the first subband signal;
injecting at least one tone signal that lies within the transition frequency band into the first downsampled subband signal;
generating a first processed subband signal by performing an audio processing on the first downsampled subband signal;
measuring in real-time amplitude and phase in the transition frequency band of the first downsampled subband signal and the first processed subband signal;
processing in real-time the measurements to calculate a change in amplitude and phase in the transition frequency band;
calculating in real-time both an amplitude compensation and a phase compensation for the second frequency subband to approximately match the measured change in amplitude and phase in the first frequency subband;
generating in real-time a second processed subband signal by applying said amplitude and phase compensation to the transition band of the second subband signal;
removing said at least one tone signal from the first processed subband signal; and
combining the first and second processed subband signals to reconstruct an output audio signal.

2. The method of claim 1, further comprising:
determining whether there is sufficient amplitude of the first downsampled subband signal in the transition band to calculate the change in amplitude and phase;
determining from the measured amplitude and phase whether the first downsampled signal has sufficient tonal content in the transition band to calculate the change in amplitude and phase; and
selectively enabling or disabling the injection of the one or more tone signals.

3. The method of claim 1, further comprising:
measuring the amplitude and phase in the full first frequency subband of the first downsampled subband signal;
determining the amplitude of the one or more tone signals to be higher than a noise signal in the transition band but low enough to make minimal change to the amplitude in the full first frequency subband; and
selecting the phase and frequency of the one or more tone signals to avoid cancellation of the first downsampled subband signal in the transition band.

4. The method of claim 1, wherein the audio processing is performed on blocks of samples of the first downsampled subband signal, wherein the real-time amplitude and phase measurements and the application of said amplitude and phase compensation are performed on each block of samples.

5. The method of claim 1, wherein the at least one tone signal comprises multiple tone signals spaced at different frequencies in the transition band.

6. The method of claim 5, wherein calculating the amplitude and phase compensation comprises calculating a weighted average of the measurements for the multiple tone signals to produce a single amplitude compensation value and a single delay compensation value.

7. The method of claim 5, wherein calculating the amplitude and delay compensation comprises calculating one or more compensation filters whose amplitude and phase characteristics approximately match amplitude and phase characteristics of the audio processing in the transition band.

8. The method of claim 1, further comprising:
processing amplitude measurements of the first downsampled subband signal and the first processed subband signal over the first frequency subband to calculate a change in amplitude over the first frequency subband caused by the audio processing,
wherein the amplitude compensation is calculated as a function of the amplitude change over the first frequency subband and the amplitude change over the transition frequency band to balance perfect reconstruction of the output audio signal and preservation of an intended gain or signal level of the audio processing.

9. The method of claim 8, wherein $$m_{coef} = f(m_{\delta tr}, m_{\delta RMS}),$$

$$f(m_{\delta tr}, m_{\delta RMS}) = G(d_{\delta rms\_tr}, \tau),$$

$$d_{\delta rms\_tr} = m_{\delta RMS}(dB) - m_{\delta tr}(dB),$$

$m_{coef}$ is the amplitude compensation value to be applied to the second subbands, $f(m_{\delta tr}, m_{\delta RMS})$ is a function that calculates the amplitude compensation value $m_{coef}$ based on the transition band amplitude change ($m_{\delta tr}$) and the first frequency subband change ($m_{\delta RMS}$), $G(\ )$ determines a balance between the transition band and the first frequency band as a function of amplitude difference $d_{\delta rms\_tr}$ and target threshold $\tau$.

10. The method of claim 1, wherein the audio processing is one of a non-linear process, a linear but time-variant process or a linear or non-linear process subject to user selectable control parameters whereby said audio processing produces amplitude and phase changes that are time-variant, wherein the calculation and application of the amplitude and phase compensation is time-variant.

11. The method of claim 1, wherein the real-time amplitude and phase measurements and the application of said amplitude and phase compensation are performed only in the transition band.

12. The method of claim 1, wherein the method is implemented in a quadrature mirror filter (QMF) bank, said first frequency subband signal is maximally decimated to the sampling rate of the audio processing, and wherein combining the processed signals includes expanding or upsampling the processed signals to an output sampling rate.

13. The method of claim 1, further comprising:
converting the output audio output signal to an analog audio signal; and
transducing via one or more speakers the analog audio signal to sound.

14. The method of claim 1, wherein the method is implemented in one or more digital processors and memory.

15. The method of claim 1, further comprising:
removing the signal in the transition band from the first downsampled subband signal such that the measurements of amplitude or phase measure only the at least one tone signal before and after audio processing, and
injecting the signal in the transition band to the first processed subband signal.

16. A method of audio reproduction, comprising:
splitting a first digital audio signal into at least a first and a second frequency subbands to generate at least a first and a second subband signal, said first and second frequency subbands separated by a transition frequency band;
generating a first downsampled subband signal by downsampling or decimating the first subband signal;
generating a first processed subband signal by performing an audio processing on the first downsampled subband signal;
measuring in real-time amplitude and phase in the transition frequency band of the first downsampled subband signal and the first processed subband signal;
processing in real-time the measurements to calculate a change in amplitude and phase in the transition frequency band;
calculating in real-time both an amplitude compensation and a phase compensation for the second frequency subband to approximately match the measured change in amplitude and phase in the first frequency subband;
generating in real-time a second processed subband signal by applying said amplitude and phase compensation to the transition band of the second subband signal; and
combining the first and second processed subband signals to reconstruct an output audio signal.

17. The method of claim 16, further comprising:
determining whether there is sufficient amplitude of the first downsampled subband signal in the transition band to calculate the change in amplitude and phase;
determining from the measured amplitude and phase whether the first downsampled signal has sufficient tonal content in the transition band to calculate the change in amplitude and phase; and
if the amplitude or tonal content is insufficient, selectively disabling the calculation of the amplitude compensation and phase compensation.

18. The method of claim 17, wherein if the amplitude or tonal content is insufficient, selectively disabling the application of the amplitude and phase compensation to the transition band of the second subband signal.

19. The method of claim 17, wherein if the amplitude or tonal content is insufficient, applying the last calculated amplitude and phase compensation to the transition band of the second subband signal.

20. The method of claim 16, wherein the audio processing is performed on blocks of samples of the first downsampled subband signal, wherein the real-time amplitude and phase measurements and the application of said amplitude and phase compensation are performed on each block of samples.

21. An audio reproduction system, comprising:
a quadrature mirror filter (QMF) bank configured to split a digital audio signal into at least a lowest and a highest frequency subbands to generate at least a first and a second subband signal, said lowest and highest frequency subbands separated by a transition frequency band, and to decimate at least the first subband signal to generate a first downsampled subband signal;

an audio processor configured to perform audio processing on the first downsampled subband signal to generate a first processed subband signal;

amplitude and phase compensators configured to apply amplitude and phase compensation to the second subband signal to generate a second processed subband signal; and a compensation unit configured to in real-time measure amplitude and phase in the transition frequency band of the first downsampled subband signal and the first processed subband signal before and after the audio processor, respectively, calculate a change in amplitude and phase in the transition frequency band, and calculate updates for the amplitude and phase compensation to approximately match the calculated change, wherein said QMF filter is configured to expand at least the first processed subband signal and to combine the first and second processed subband signals to reconstruct an audio output.

22. The audio reproduction system of claim 21, wherein the compensation unit is configured to determine whether the first downsampled subband signal has sufficient amplitude and tonal content in the transition band to calculate the change in amplitude and phase transition.

23. The audio reproduction system of claim 22, wherein if either the amplitude or tonal content is insufficient, the compensation unit is configured to inject at least one tone signal that lies within the transition frequency band into the first downsampled subband signal and to remove said at least one tone signal from the first processed subband signal.

24. The audio reproduction system of claim 23, wherein the compensation unit is configured to measure the amplitude and phase in the full lowest frequency subband of the first downsampled subband signal, determine the amplitude of the one or more tone signals to be higher than a noise signal in the transition band but low enough to make minimal change to the amplitude in the full first frequency subband and select the phase and frequency of the one or more tone signals to avoid cancellation of the first downsampled subband signal in the transition band.

25. The audio reproduction system of claim 21, wherein the audio processor performs the audio processing on blocks of samples of the first downsampled subband signal, wherein the compensation unit processes each block of samples to update the amplitude and phase compensation.

26. The audio reproduction system of claim 21, wherein the compensation unit is configured to process amplitude measurements of the first downsampled subband signal and the first processed subband signal over the lowest frequency subband to calculate a change in amplitude over the lowest frequency subband caused by the audio processing, wherein the compensation unit is configured to calculate the amplitude compensation as a function of the amplitude change over the lowest frequency subband and the amplitude change over the transition frequency band to balance perfect reconstruction of the output audio signal and preservation of an intended gain or signal level of the audio processing.

* * * * *